(12) United States Patent
Oka et al.

(10) Patent No.: US 12,328,084 B2
(45) Date of Patent: Jun. 10, 2025

(54) PROPULSION CONTROLLER AND METHOD OF CONTROLLING FILTER CAPACITOR VOLTAGE

(71) Applicant: Mitsubishi Electric Corporation, Tokyo (JP)

(72) Inventors: Atsushi Oka, Tokyo (JP); Yu Takaira, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 18/568,381

(22) PCT Filed: Jul. 12, 2021

(86) PCT No.: PCT/JP2021/026121
§ 371 (c)(1),
(2) Date: Dec. 8, 2023

(87) PCT Pub. No.: WO2023/286122
PCT Pub. Date: Jan. 19, 2023

(65) Prior Publication Data
US 2024/0275323 A1 Aug. 15, 2024

(51) Int. Cl.
*H02P 27/08* (2006.01)
*B61L 15/00* (2006.01)
*H03H 7/06* (2006.01)

(52) U.S. Cl.
CPC .......... *H02P 27/08* (2013.01); *B61L 15/0058* (2024.01); *H03H 7/06* (2013.01)

(58) Field of Classification Search
CPC ...... H02P 27/06; H02P 27/08; B61L 15/0058; B60L 15/00; H03H 7/06
See application file for complete search history.

(56) References Cited

U.S. PATENT DOCUMENTS

2013/0249460 A1* 9/2013 Sugahara ........... H05K 7/20945
363/55
2020/0358378 A1* 11/2020 Takayama ............... H02P 27/08

FOREIGN PATENT DOCUMENTS

JP H09261966 A 10/1997

OTHER PUBLICATIONS

International Search Report (PCT/ISA/210) and Written Opinion (PCT/ISA/237) with translation mailed on Aug. 31, 2021, by the Japan Patent Office as the International Searching Authority for International Application No. PCT/JP2021/026121. (9 pages).

* cited by examiner

*Primary Examiner* — Jeffrey M Shin
(74) *Attorney, Agent, or Firm* — BUCHANAN, INGERSOLL & ROONEY PC

(57) ABSTRACT

A propulsion controller includes a controller that performs mode switching control and power consumption control, on the basis of a filter capacitor voltage and a main motor speed. The mode switching control switches between an asynchronous mode and a synchronous mode. The power consumption control causes power consumption resistor of a brake chopper circuit to consume regenerative power generated when a main motor operates as a generator. The controller controls an operating point, depending on the position of which the asynchronous mode and the synchronous mode are switched, to a desired position by changing a target value of the filter capacitor voltage controlled by the power consumption control.

5 Claims, 3 Drawing Sheets

PROPULSION CONTROLLER AND METHOD OF CONTROLLING FILTER CAPACITOR VOLTAGE

FIELD

The present disclosure relates to a propulsion controller to be installed to a railway vehicle, and a method of controlling a voltage of a filter capacitor included in the propulsion controller.

BACKGROUND

Patent Literature 1 below discloses a propulsion controller including an inverter that outputs an alternating-current voltage of a variable voltage and of a variable frequency to a main motor of a railway vehicle by pulse width modulation (PWM) control.

In a propulsion controller, a triangular wave comparison method of generating a PWM pulse by comparing a carrier signal of a triangular wave continuous at a constant cycle with a voltage command value that is a command value of a voltage output from an inverter is commonly used. The PWM control in the triangular wave comparison method is roughly divided into asynchronous PWM control and synchronous PWM control.

In the propulsion controller, an asynchronous mode that performs the asynchronous PWM control, and a synchronous mode that performs the synchronous PWM control are provided. The asynchronous mode is performed in a case where carrier frequency is sufficiently higher than the frequency of the voltage command value. The carrier frequency is repetition frequency of the carrier signal. In the asynchronous mode, the carrier frequency is fixed to be constant, and only the frequency of the voltage command value is changed. The synchronous mode is performed in a case where the carrier frequency and the frequency of the voltage command value are relatively close to each other. In the synchronous mode, a ratio between the carrier frequency and the frequency of the voltage command value is set such that the carrier frequency is an integer multiple of the frequency of the voltage command value. Furthermore, in a case where variable voltage control-variable frequency control is performed in the synchronous mode: control is performed in which the number of pulses in a PWM signal is increased when an output voltage output from the inverter is small; and the number of pulses is gradually decreased as the output voltage and fundamental frequency of the output voltage increase.

In the asynchronous mode, switching frequency continuously changes without depending on the fundamental frequency of the output voltage. The switching frequency is the frequency at which a switching element of the inverter repeats on and off. On the other hand, in the synchronous mode, the switching frequency is lower than that in the case of the asynchronous mode, and is close to audible frequency. Therefore, the synchronous mode has a disadvantage that electromagnetic noise becomes larger than that in the asynchronous mode.

CITATION LIST

Patent Literature

Patent Literature 1: Japanese Patent Application Laid-open No. H09-261966

SUMMARY OF INVENTION

Problem to be Solved by the Invention

In a typical propulsion controller, switching between the asynchronous mode and the synchronous mode is performed on the basis of a filter capacitor voltage and a main motor speed that is a rotational speed of a main motor. However, the filter capacitor voltage commonly depends on an overhead contact line voltage applied from an overhead contact line, a third rail, or the like. Therefore, even in a case where each identical device outputs an output voltage at an identical voltage and an identical frequency, depending on the filter capacitor voltage, there are cases where the operation mode becomes the synchronous mode and electromagnetic noise increases even though the output frequency is not changed. For example, the operation mode is the synchronous mode in most cases during a constant speed brake operation with a constant output frequency. Therefore, there is a problem that the electromagnetic noise increases.

The present disclosure has been made in view of the above, and an object of the present disclosure is to obtain a propulsion controller capable of reliably suppressing unintended increase of electromagnetic noise.

Means to Solve the Problem

In order to solve the problem described above and achieve the object, a propulsion controller according to the present disclosure includes: a filter capacitor; an inverter; a power consumption circuit; and a controller. The filter capacitor smooths a voltage of power supplied from an overhead contact line via a line breaker. The inverter is connected in parallel with the filter capacitor, and applies an alternating-current voltage at a variable voltage and a variable frequency to a main motor to be installed to a railway vehicle by pulse width modulation control including an asynchronous mode and a synchronous mode. The power consumption circuit includes a switching element and a power consumption resistor connected in series with the switching element, and is connected in parallel with the inverter. The controller performs mode switching control and power consumption control. The mode switching control is a control that switches between the asynchronous mode and the synchronous mode on the basis of the filter capacitor voltage that is a voltage of the filter capacitor and a main motor speed that is a rotational speed of the main motor. The power consumption control is a control that causes the power consumption resistor configured to consume regenerative power generated when the main motor operates as a generator. The controller is configured to control an operating point, where the asynchronous mode and the synchronous mode are switched, to a desired position by changing a target value of the filter capacitor voltage controlled by the power consumption control.

Effects of the Invention

The propulsion controller according to the present disclosure has an effect of reliably suppressing an unintended increase in electromagnetic noise.

DESCRIPTION OF EMBODIMENT

Hereinafter, a propulsion controller and a method of controlling a filter capacitor voltage according to an embodiment of the present disclosure will be described in detail with reference to the accompanying drawings. Note that the embodiment described below is an example, and the scope of the present disclosure is not limited by the embodiment below.

Embodiment

Figure 1:
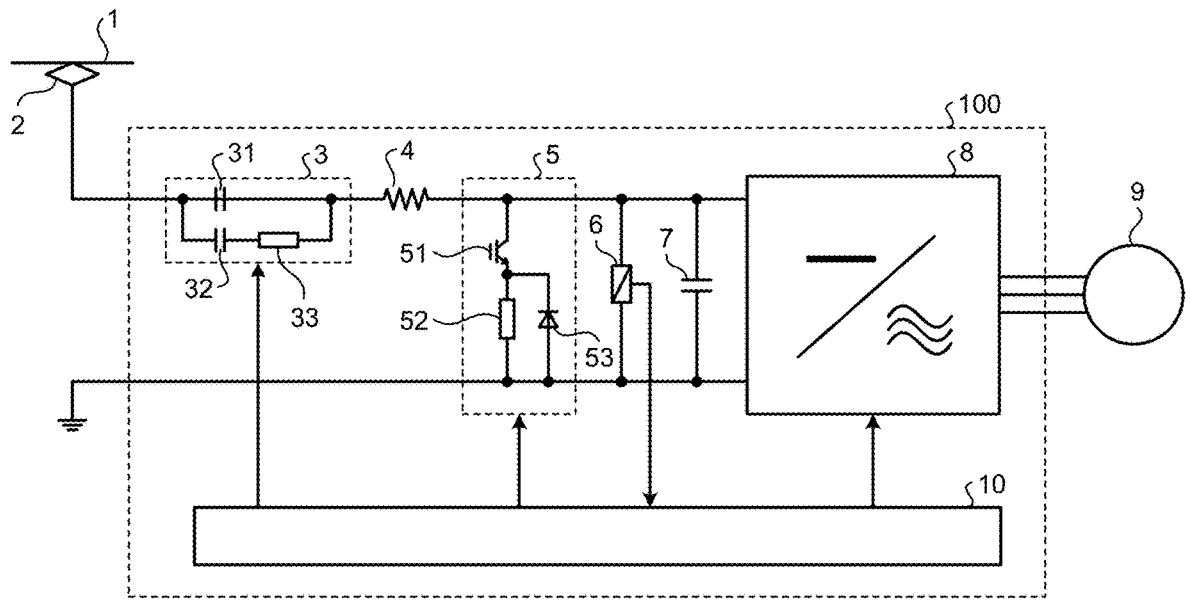
FIG. 1 is a diagram illustrating a configuration example of a propulsion controller according to an embodiment.

FIG. 1 is a diagram illustrating a configuration example of a propulsion controller 100 according to an embodiment. As illustrated in FIG. 1, the propulsion controller 100 according to the embodiment is configured: to receive direct-current power from an overhead contact line 1 via a power collector 2, an opening/closing circuit unit 3, and a reactor 4; to convert the received direct-current power into alternating-current power by an inverter 8 that is a PWM inverter; and to drive a main motor 9 of a railway vehicle (not illustrated).

In addition to the opening/closing circuit unit 3, the reactor 4, and the inverter 8, the propulsion controller 100 includes: a brake chopper circuit 5; a voltage detector 6; a filter capacitor 7; and a controller 10.

The opening/closing circuit unit 3 includes: line breakers 31 and 32; and a charging resistor 33. The line breaker 32 and the charging resistor 33 are connected in series. The line breaker 31 is connected in parallel with a series circuit of the line breaker 32 and the charging resistor 33. When the filter capacitor 7 is initially charged, the line breaker 31 is opened and the line breaker 32 is closed. As a result, the filter capacitor 7 is charged by the power from the overhead contact line via the charging resistor 33. When the initial charging of the filter capacitor 7 is completed, the line breaker 32 is opened and the line breaker 31 is closed. As a result, the propulsion controller 100 enters a state where the operation can be started.

The filter capacitor 7 smooths a voltage of the power supplied from the overhead contact line 1 via the opening/closing circuit unit 3. The inverter 8 is connected in parallel with the filter capacitor 7, and applies an alternating-current voltage at a variable voltage and a variable frequency to the main motor 9 by PWM control including an asynchronous mode and a synchronous mode.

The brake chopper circuit 5 is connected in parallel with each of the filter capacitor 7 and the inverter 8. The brake chopper circuit 5 includes: a switching element 51; a power consumption resistor 52 connected in series with the switching element 51; and a diode 53 connected in parallel with the power consumption resistor 52. Note that the diode 53 may be omitted. The brake chopper circuit 5 operates as a power consumption circuit that causes the power consumption resistor 52 configured to consume regenerative power generated when the main motor 9 operates as a generator.

The voltage detector 6 detects a filter capacitor voltage that is a voltage of the filter capacitor 7. A value detected by the voltage detector 6 is input to the controller 10. The controller 10 controls opening and closing of the line breakers 31 and 32 on the basis of the filter capacitor voltage. In addition, the controller 10 performs power consumption control that causes the power consumption resistor 52 configured to consume regenerative power generated by the main motor 9 on the basis of the filter capacitor voltage. Furthermore, the controller 10 performs mode switching control that switches between the asynchronous mode and the synchronous mode on the basis of the filter capacitor voltage and a main motor speed that is a rotational speed of the main motor 9. Information on the main motor speed may be obtained by any means or method. If the main motor 9 is provided with a speed detector, a value detected by the speed detector may be used. Alternatively, if vehicle speed information managed by a vehicle information management device (not illustrated) can be obtained, the main motor speed can be obtained by conversion using the vehicle speed information.

Figure 2:
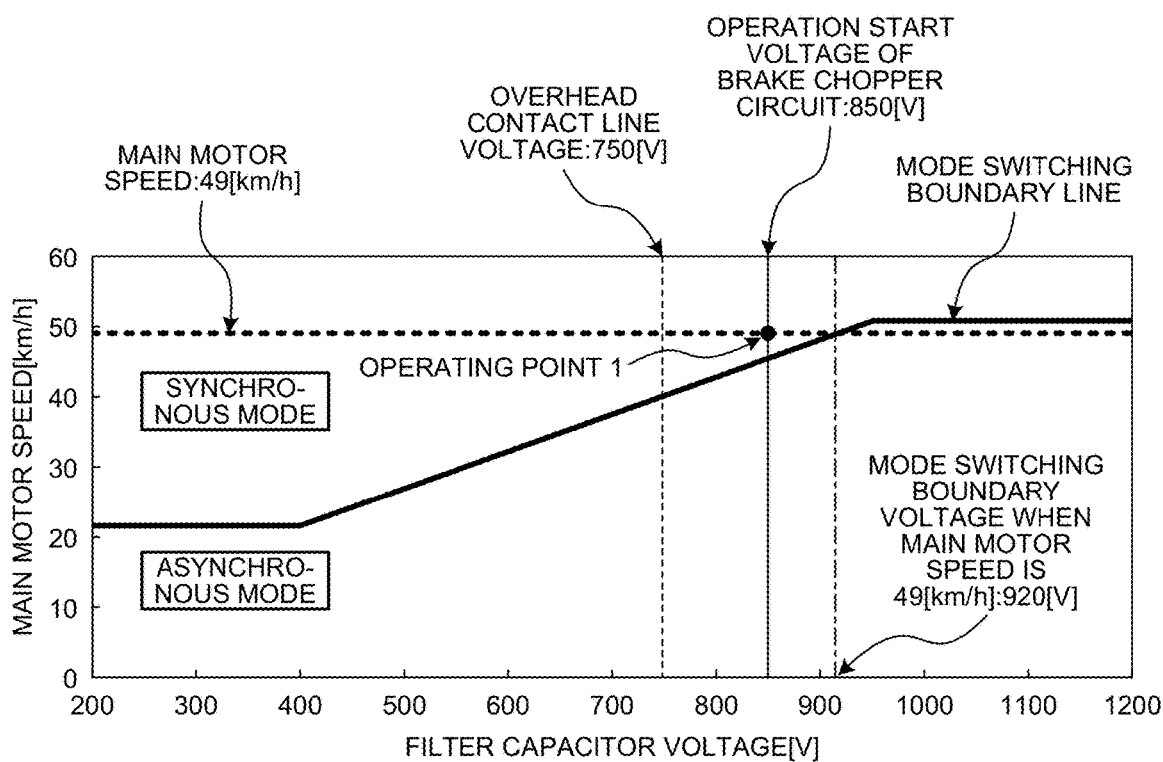
FIG. 2 is a diagram provided for illustrating a problem in a prior art.
Figure 3:
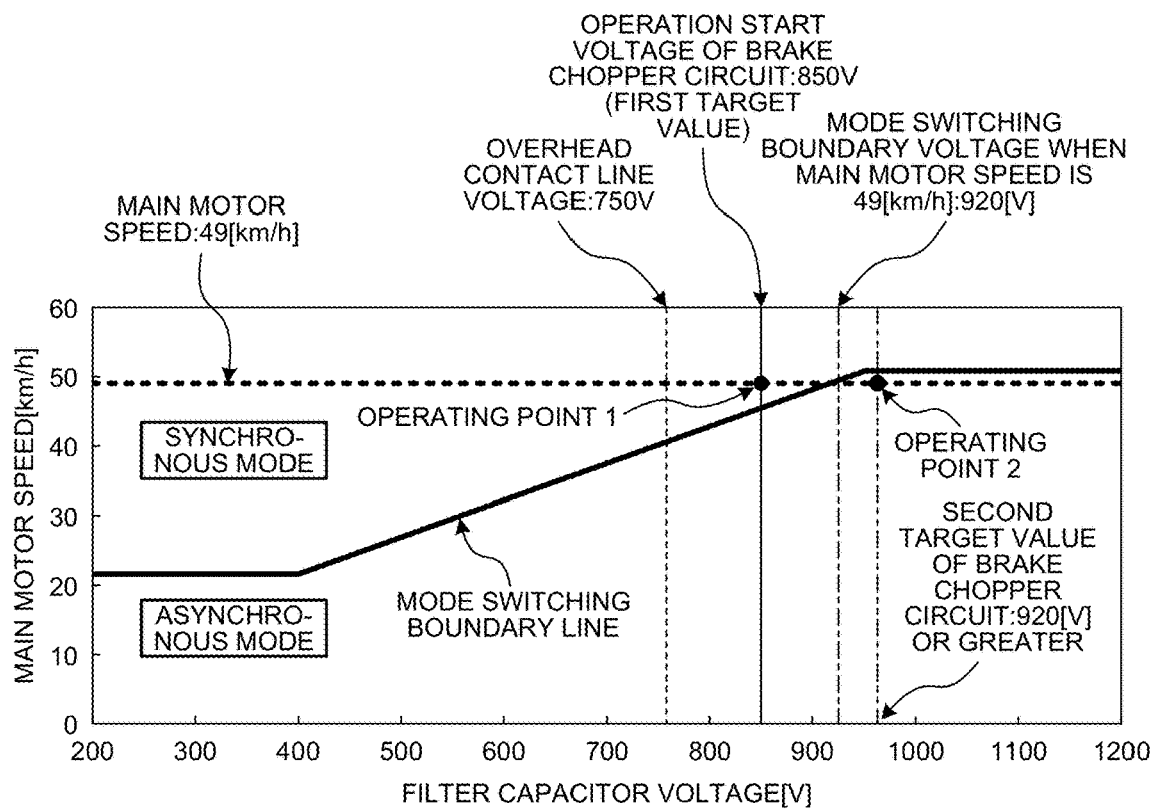
FIG. 3 is a diagram provided for illustrating an operational principle of the embodiment that solves the problem in the prior art.

Next, a reason why the problem described above occurs and a method for solving the problem will be described with reference to FIGS. 2 and 3. FIG. 2 is a diagram provided for illustrating the problem in the prior art. FIG. 3 is a diagram provided for illustrating an operational principle of the embodiment that solves the problem in the prior art.

In FIGS. 2 and 3, the horizontal axis represents the filter capacitor voltage and the vertical axis represents the main motor speed. Furthermore, in both the drawings, a bold solid line represents a boundary line of mode switching, and a bold broken line represents a speed of 49 [km/h] as an example of the main motor speed. Moreover, a thin broken line represents a voltage of 750 [V] as an example of an overhead contact line voltage, and a thin solid line represents 850 [V], which is higher than the overhead contact line voltage by 100 [V], as an example of an operation start voltage of the brake chopper circuit 5. Note that the operation start voltage of the brake chopper circuit 5 depends on the overhead contact line voltage, and cannot be arbitrarily set. If the operation start voltage is arbitrarily set in each vehicle in operation to which the propulsion controller 100 is installed, a circuit breaker in a substation (not illustrated) may be unnecessarily tripped. If the circuit breaker in the substation is tripped, not only the operation of an own vehicle is stopped, but also the operation of other vehicles is stopped, which greatly affects the vehicle operation.

In FIGS. 2 and 3, in a case where the main motor speed is 49 [km/h], a mode switching boundary voltage is 920 [V], which is a voltage at a point where the horizontal axis intersects a chain line that is drawn parallel to the vertical axis and passes through an intersection of the mode switching boundary line and the main motor speed. Therefore: in a case where the filter capacitor voltage is equal to 920 [V] or less than 920 [V], the operation mode is the synchronous mode; and in a case where the filter capacitor voltage is greater than 920 [V], or equal to 920 [V], the operation mode is the asynchronous mode. In this manner, the chain line represents the mode switching boundary voltage.

In FIG. 2, in a case where the propulsion controller according to the prior art performs constant speed brake operation that maintains a constant vehicle speed converted to the main motor speed of 49 [km/h], the operation is performed at an operating point 1, and thus the operation is inevitably performed in the synchronous mode. During the operation, the filter capacitor voltage is maintained at 850 [V] by the brake chopper circuit 5. Therefore, the synchronous mode is continued during the constant speed brake operation. Therefore, in the prior art, the operation mode is the synchronous mode in most cases during the constant speed brake operation. Therefore, there is a problem that the electromagnetic noise increases.

Figure 4:
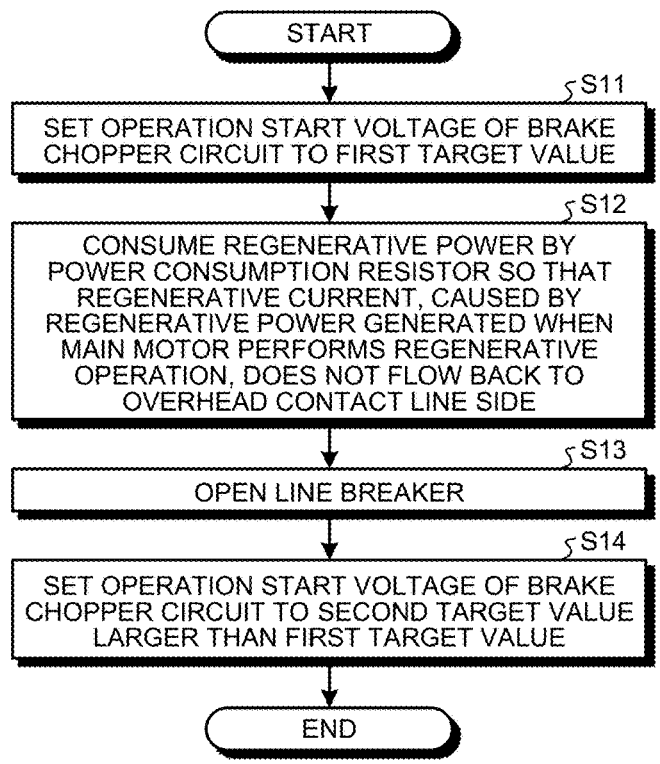
FIG. 4 is a flowchart illustrating a processing flow in a controller of the embodiment.

In the prior art illustrated in FIG. 2, the thin solid line represents the operation start voltage of the brake chopper circuit 5. On the other hand, in the present embodiment, the thin solid line is regarded as a concept of a first target value of the brake chopper circuit 5 as illustrated in FIG. 3. Furthermore, in the present embodiment, a concept of a second target value of the brake chopper circuit 5 is added, and this concept is represented by a chain double-dashed line. Hereinafter, the operation based on this concept will be described with reference to FIG. 4. FIG. 4 is a flowchart illustrating a processing flow in the controller 10 of the embodiment.

First, the controller 10 sets the operation start voltage of the brake chopper circuit 5 to the first target value (step S11). In the example in FIG. 3, the first target value is set to 850 [V]. The controller 10 causes the power consumption resistor 52 configured to consume regenerative power so that a regenerative current, caused by the regenerative power generated when the main motor 9 performs regenerative operation, does not flow back to a side of the overhead contact line 1 (step S12). The controller 10 opens the line breaker 31 at this timing (step S13). Note that the line breaker 32 is in an open state during the operation of the propulsion controller 100. Next, the controller 10 sets the operation start voltage of the brake chopper circuit 5 to the second target value larger than the first target value (step S14). In the example in FIG. 3, the second target value is set to about 960 [V]. Note that in the case of the example in FIG. 3, it is sufficient that the second target value is 920 [V] or greater.

Supplementary description will be made about the above operation. In step S12, the regenerative power generated when the main motor 9 performs regenerative operation is consumed by the power consumption resistor 52. As a result, the regenerative current hardly flows back to the side of the overhead contact line 1. Therefore, the line breaker 31 can be opened. Furthermore, by opening the line breaker 31, the operation start voltage of the brake chopper circuit 5 can be set without being restricted by the overhead contact line voltage. Therefore, in step S14, the operation start voltage of the brake chopper circuit 5 is changed from the first target value to the second target value.

By the above control, the operating point of the propulsion controller 100 moves from the operating point 1 to an operating point 2. As a result, in a case where the propulsion controller 100 according to the embodiment performs constant speed brake operation that maintains a constant vehicle speed converted to the main motor speed of 49 [km/h], the operation is performed in the asynchronous mode at the operating point 2. This enables operation with reduced electromagnetic noise.

As described above, the propulsion controller according to the embodiment includes the controller that performs the mode switching control and the power consumption control, on the basis of the filter capacitor voltage and the main motor speed. The mode switching control switches between the asynchronous mode and the synchronous mode. The power consumption control causes the power consumption resistor of the brake chopper circuit, which is a power consumption circuit, to consume regenerative power generated when the main motor operates as a generator. The controller is configured to control the operating point, where the asynchronous mode and the synchronous mode are switched, to a desired position by changing the target value of the filter capacitor voltage controlled by the power consumption control. As a result, the operating point of the propulsion controller can be controlled such that the operation is performed in the asynchronous mode that is advantageous from the viewpoint of electromagnetic noise. Therefore, an effect of reliably suppressing an unintended increase in electromagnetic noise is obtained.

Note that in the above control, the target value of the filter capacitor voltage is preferably changed after the overhead contact line is electrically disconnected from the filter capacitor by the line breaker. In this way, it is possible to minimize the influence on the side of the overhead contact line caused by changing the target value of the filter capacitor voltage.

Furthermore, the controller may set the target value of the filter capacitor voltage on the basis of the main motor speed. In this way, even in a case where the vehicle speed at the time of performing the constant speed brake operation is different depending on the route on which the vehicle to which the propulsion controller is installed travels, the target value of a desired filter capacitor voltage can be set on the basis of the vehicle speed. This enables reliable control according to the present embodiment.

Furthermore, according to a method of controlling the filter capacitor voltage of the embodiment, in a first step, the operation start voltage of the brake chopper circuit, which is a power consumption circuit, is set to the first target value. In a second step, control is performed to cause the power consumption resistor configured to consume the regenerative power so that the regenerative current, caused by the regenerative power generated when the main motor performs regenerative operation, does not flow back to the side of the overhead contact line. In a third step, the line breaker is controlled to be opened. In a fourth step, the operation start voltage of the brake chopper circuit is set to the second target value larger than the first target value. According to such a method of controlling the filter capacitor voltage including the processing of the first to fourth steps, the control according to the embodiment described above can be smoothly performed. As a result, the control can be easily performed without making the configuration of the control system complicated. Therefore, it is possible to obtain an effect that the control according to the embodiment can be implemented at low cost even in a case where the method is applied to various propulsion controllers different from that in FIG. 1.

Figure 5:
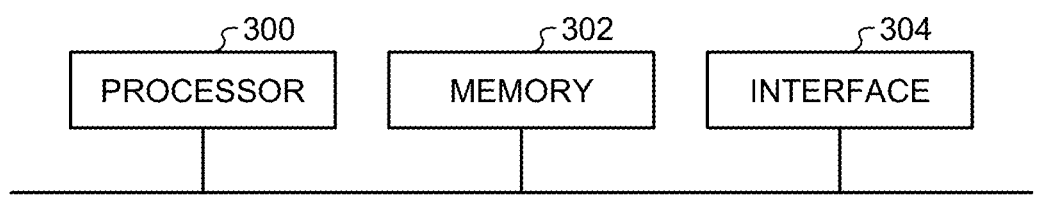
FIG. 5 is a block diagram illustrating an example of a hardware configuration that implements functions of the controller in the embodiment.
Figure 6:
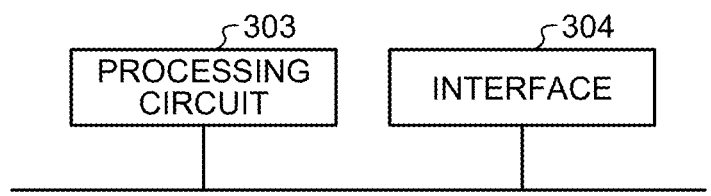
FIG. 6 is a block diagram illustrating another example of the hardware configuration that implements functions of the controller in the embodiment.

Finally, a hardware configuration for implementing functions of the controller 10 described above will be described with reference to the drawings of FIGS. 5 and 6. FIG. 5 is a block diagram illustrating an example of a hardware configuration that implements the functions of the controller 10 in the embodiment. FIG. 6 is a block diagram illustrating another example of the hardware configuration that implements the functions of the controller 10 in the embodiment.

In a case where some or all of the functions of the controller 10 in the embodiment are implemented, a configuration including a processor 300, a memory 302, and an interface 304 as illustrated in FIG. 5 is used. The processor 300 performs a calculation. The memory 302 stores a program read by the processor 300. Signals are input and output through the interface 304.

The processor 300 is a calculation means. The processor 300 may be a calculation means called a microprocessor, a microcomputer, a central processing unit (CPU), or a digital signal processor (DSP). Furthermore, examples of the memory 302 include a nonvolatile or volatile semiconductor memory such as a random access memory (RAM), a read only memory (ROM), a flash memory, an erasable programmable ROM (EPROM), or an electrically EPROM (EEPROM (registered trademark)), a magnetic disk, a flexible disk, an optical disk, a compact disk, a mini disk, and a digital versatile disc (DVD).

The memory 302 stores the program for executing functions of the controller 10 in the embodiment. The processor 300 is configured to perform the above processing by transmitting and receiving necessary information via the interface 304, executing the program stored in the memory 302, and referring to a table stored in the memory 302. A result of calculation by the processor 300 may be stored in the memory 302.

Furthermore, in a case where some of the functions of the controller 10 in the embodiment are implemented, a processing circuit 303 illustrated in FIG. 6 may also be used. The processing circuit 303 corresponds to a single circuit, a composite circuit, an application specific integrated circuit (ASIC), a field-programmable gate array (FPGA), or a combination thereof. Information input to the processing circuit 303 and information output from the processing circuit 303 may be obtained via the interface 304.

Note that some of the processes to be performed in the controller 10 may be performed by the processing circuit 303, and processes not performed by the processing circuit 303 may be performed by the processor 300 and the memory 302.

The above configurations described in the embodiment are examples, and may be combined with other known techniques, and the above configurations may be partly omitted or changed without departing from the gist.

REFERENCE SIGNS LIST 1 overhead contact line; 2 power collector; 3 opening/closing circuit unit; 4 reactor; 5 brake chopper circuit; 6 voltage detector; 7 filter capacitor; 8 inverter; 9 main motor; 10 controller; 31, 32 line breaker; 33 charging resistor; 51 switching element; 52 power consumption resistor; 53 diode; 100 propulsion controller; 300 processor; 302 memory; 303 processing circuit; 304 interface.

The invention claimed is:

1. A propulsion controller, comprising:
a filter capacitor configured to smooth a voltage of power supplied from an overhead contact line via a line breaker;
an inverter configured to apply an alternating-current voltage at a variable voltage and a variable frequency to a main motor to be installed to a railway vehicle by pulse width modulation control including an asynchronous mode and a synchronous mode, the inverter being connected in parallel with the filter capacitor;
a power consumption circuit including a switching element and a power consumption resistor connected in series with the switching element, the power consumption circuit being connected in parallel with the inverter; and
a controller configured to perform:
a mode switching control switching between the asynchronous mode and the synchronous mode, on a basis of a filter capacitor voltage that is a voltage of the filter capacitor and a main motor speed that is a rotational speed of the main motor; and
a power consumption control causing the power consumption resistor configured to consume regenerative power generated when the main motor operates as a generator, wherein
the controller is configured to control an operating point, where the asynchronous mode and the synchronous mode are switched, to a desired position by changing a target value of the filter capacitor voltage controlled by the power consumption control.

2. The propulsion controller according to claim 1, wherein the controller is configured to change the target value after the overhead contact line is electrically disconnected from the filter capacitor by the line breaker.

3. The propulsion controller according to claim 2, wherein the controller is configured to set the target value on the basis of the main motor speed.

4. The propulsion controller according to claim 1, wherein the controller is configured to set the target value on the basis of the main motor speed.

5. A method of controlling a filter capacitor voltage applied to a propulsion controller that includes:
a filter capacitor configured to smooth a voltage of power supplied from an overhead contact line via a line breaker;
an inverter configured to apply, by pulse width modulation control including an asynchronous mode and a synchronous mode, an alternating-current voltage at a variable voltage and a variable frequency to a main motor to be installed to a railway vehicle, the inverter being connected in parallel with the filter capacitor; and
a power consumption circuit including a switching element and a power consumption resistor connected in series with the switching element, the power consumption circuit being connected in parallel with the inverter, the method comprising:
setting an operation start voltage of the power consumption circuit to a first target value;
causing the power consumption resistor configured to consume regenerative power so that a regenerative current, caused by the regenerative power generated when the main motor performs regenerative operation, does not flow back to a side of the overhead contact line;
opening the line breaker; and
setting the operation start voltage of the power consumption circuit to a second target value larger than the first target value.

* * * * *